(12) United States Patent
Schneider

(10) Patent No.: US 7,999,705 B2
(45) Date of Patent: Aug. 16, 2011

(54) UNICODE-COMPATIBLE BASE-N RANGE CODING

(75) Inventor: James Paul Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 0 days.

(21) Appl. No.: 12/628,094

(22) Filed: Nov. 30, 2009

(65) Prior Publication Data

US 2011/0128169 A1    Jun. 2, 2011

(51) Int. Cl.
  *H03M 7/00*    (2006.01)
(52) U.S. Cl. .............. 341/50; 341/51; 341/65; 341/67
(58) Field of Classification Search ............ 341/50, 341/51, 67, 65
  See application file for complete search history.

(56) References Cited

U.S. PATENT DOCUMENTS

| | | | |
|---|---|---|---|
| 6,737,994 B2 * | 5/2004 | Davis et al. | 341/65 |
| 7,574,719 B1 * | 8/2009 | Shield et al. | 725/39 |
| 2004/0006768 A1 * | 1/2004 | Deshpande et al. | 725/44 |
| 2009/0055395 A1 * | 2/2009 | Jenks et al. | 707/6 |
| 2009/0327621 A1 * | 12/2009 | Kliot et al. | 711/154 |

* cited by examiner

*Primary Examiner* — Jean B Jeanglaude
(74) *Attorney, Agent, or Firm* — Lowenstein Sandler PC

(57) ABSTRACT

A character data set is compressed with a compression algorithm module of a computer system to generate one or more streams of encoded values. The compression module is configured to compress the character data set with an base-n range encoder to generate one or more streams of encoded values with UTF-8 or UTF-16. A code points mapper assigns the encoded values to code points in a Unicode format. A UTF encoder encodes the streams of assigned encoded values.

20 Claims, 3 Drawing Sheets

UNICODE-COMPATIBLE BASE-N RANGE CODING

TECHNICAL FIELD

Embodiments of the present invention relate to computing systems, and more particularly, to implementation of character data in different computer languages.

BACKGROUND

There is a mismatch between the data representation requirements of different programming languages. The motivating case is C, the implementation language for the Apache HTTPD web server, which presents character string data as a sequential array of octets, vs. JavaScript, which views characters in a string as indivisible and atomic. When a string that violates the implicit assumption of one character per octet location made by C is processed by a program implemented in C, and the result passed to a program implemented in JavaScript, which performs further processing before displaying a reconstructed string, chances are excellent that the displayed string will not be what was intended.

This is particularly a problem in the context of compression. Not only can character codes be potentially outside the range of a single octet, code values can also span octets.

This is a problem in the context of cryptography, because most cryptographic algorithms operate on binary data without regard to character encodings, and rely on the external system to manage character data appropriately. This external management does not exist in JavaScript.

BRIEF DESCRIPTION OF THE DRAWINGS

The present invention is illustrated by way of example, and not by way of limitation, in the figures of the accompanying drawings and in which.

DETAILED DESCRIPTION

Described herein is a method and apparatus for transcoding Unicode character data. A character data set is compressed with a compression algorithm module of a computer system to generate one or more streams of encoded values. The compression module is configured to compress the character data set with an base-n range encoder to generate one or more streams of encoded values with UTF-8 or UTF-16. A code points mapper assigns the encoded values to code points in a Unicode format. A UTF encoder encodes the streams of assigned encoded values.

Unicode is a mostly complete attempt at a universal character set. For most modern phoneme-based scripts (such as Latin or Cyrillic), all of the required characters in the script are in the first 55,296 characters. Indeed, for most languages, the number of characters used is a small fraction of the total range of Unicode characters.

Figure 1:
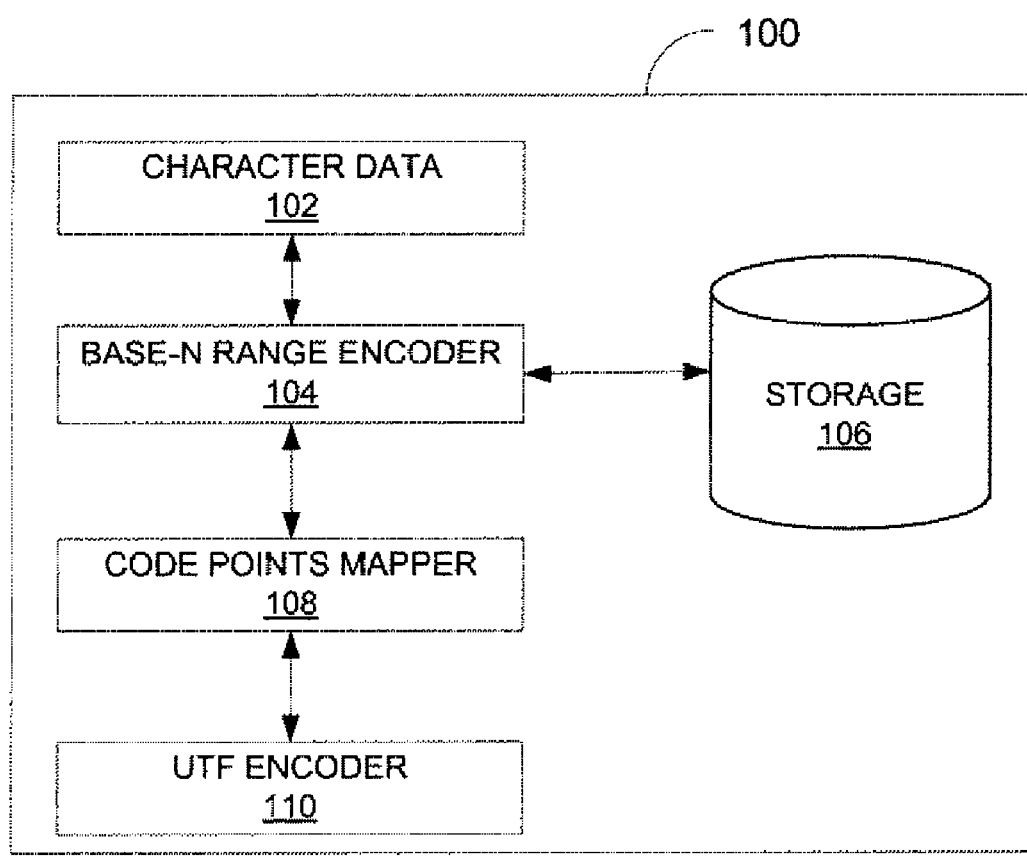
FIG. 1 is a block diagram illustrating one embodiment of a unicode-compatible compressor.

FIG. 1 is a block diagram illustrating one embodiment of a unicode-compatible compressor 100 with a storage 106. The unicode-compatible compressor 100 includes a character data receiver/generator 102, a compressor 104 coupled to the storage device 106, a code points mapper 108, and a UTF encoder 110. Character data receiver 102 generates or receives a set of character data from the storage device 106. Compressor 104 uses a compression technique that generates one or more streams of encoded values. Code points mapper 108 assigns the encoded values to code points in a Unicode format. UTF encoder 110 encodes the stream values using a Unicode Transformation Format. Encoding and decoding into a UTF would need to be managed at both ends, but this can be handled by standard components.

Note that the compression coder would have to make some decisions differently than it would in the case where a byte-based coding was used, because the "private use" code points have encodings that are typically larger than the encodings used by a byte-oriented encoder.

The Unicode standard specifies that code points U+E000-U+F8FF, U+F0000-U+FFFFD, and U+100000-U+10FFFD are reserved for private use.

In one embodiment, compressor 104 includes an entropy encoder. The entropy encoder works by replacing frequently occurring fixed-length bit sequences with shorter bit sequences, and infrequently occurring fixed-length bit sequences by longer bit sequences. Since the UTFs all use integral multiples of fixed-length bit sequences for representation, there does not seem to be much scope for entropy coding. However, by grouping several bit sequences together, they can be packed into one or more code points.

There are two possible approaches here:

In one embodiment, code points from some restricted range are used and interpreted as bit strings.

In another embodiment, code points from the "private use" ranges are used to represent bit strings, and other code points are let to represent themselves.

With the first technique, there's no requirement to use the private code points—indeed, it is more efficient to use only code points from some part of the BMP (that is, code points in the range U+0000–U+FFFD).

Both techniques are illustrated below using an adaptive order-0 PPM model. For a UTF-8 encoding, using the first technique, restricting code points to the range U+0000-U+007F means that all generated code points would occupy a single byte. For a UTF-16 encoding, an appropriate range would be U+0000-U+7FFF. However, both of these ranges have problems in that they both contain control characters that may make string handling difficult for the decompressor. For UTF-16, simply offsetting the code points to fall in the range U+0100-U+80FF suffices: 15 bits of every 16 bit character code would be used for coding purposes.

UTF-8 would require a more complex, and less efficient, approach. The code points in the range U+0021-U+007E are safe, and require 8 bits to encode. There are 94 code points in this range, so using just this range would have the effect of using about 6.55 bits of this 8 bits (81.9% efficient). Code points in the range U+00A1-U+07FF are also safe, but they require 16 bits to encode. These 1888 code points provide 10.88 bits of information for every 16 bits (68.0% efficient). Combining the ranges provides 10.95 bits of information for an average of 15.62 bits generated (70.1% efficient). It gets worse as the range is extended—the range U+0800-U+FFFD requires 24 bits to encode, and provides 15.95 bits of information (66.5% efficient).

Based on this analysis, the appropriate range for use with UTF-8 would be U+0021-U+007E. However, this entire range is not suitable to a whole-bit encoding method (such as Huffman coding), since the number of available code points is not a power of 2, and restricting the range further makes it even less efficient than it already is. For this reason, a range encoder using base-94 is the appropriate choice here.

A range coder operates by matching the current character in the input stream against a predicted probability distribution, and adjusting a pair of fractions in the range 0-1 to bracket the point in the probability distribution where the entire input stream was predicted. The probability distribution is generated by a prediction model, which can be static, or updated after each character is processed. The output of the range coder is a representation of a fraction that lies within the predicted probability distribution of the input stream.

For example, using the input stream "abracadabra", with an order 0 PPM model providing predictions, the coder starts with two fractions initialized to 0 and 1, respectively, and a model that can only encode an "escape" symbol. At the first 'a', the model predicts with a probability of 1 that it won't recognize the input symbol. The 'a' is appended to the stream (either a dedicated literals stream, or interleaved into a single output stream).

At the first 'b' (abracadabra), the model predicts with a probability of ½ that it won't recognize the input symbol, and probability of ½ that the symbol will be an 'a'. The matching prediction is that the symbol was not recognized. If the model indicates that this prediction "owns" the probability distribution from 0 to ½, the fractions would be scaled and offset to 0 and ½, respectively. Since 'b' was not recognized, the 'b' character is appended to the stream.

At the 'r' (abracadabra), the model predicts with a probability of ⅓ that it won't recognize the symbol, a probability of ⅓ that the symbol will be an 'a', and a probability of ⅓ that the symbol will be a 'b'. Since the symbol is not recognized, the probability distribution for that occurrence (0-⅓) is factored into the two fractions, making them 0 and ⅙, respectively. The 'r' is appended to the appropriate stream.

At the second 'a' (abracadabra), the model predicts with a probability of ¼ each that it won't recognize the symbol, that the symbol is an 'a', that the symbol is a 'b', and that the symbol is an 'r'. The probability distribution 'owned' by the successful prediction distribution is ¼-½, so the fractions are adjusted to 1/24 and 1/12.

Continuing this way, the fractions are adjusted to 1/24 and 1/20 for the 'c' (which is appended to the appropriate stream), 31/720 and 33/720 for the 'a', 31/720 and 219/5040 for the 'd' (which is appended to the appropriate stream), etc.

Base 94 is only suitable if the client application can reliably distinguish stream boundaries without external delimiters. In the JavaScript case, the three quoting characters ', ", and \ (single quote, double quote, and backslash) would also need to be removed from the range of acceptable characters, giving 91. In HTML and xml applications, the characters &, < and > (ampersand, less than, and greater than) would need to be removed. In JavaScript embedded in HTML, all six characters would need to be removed, giving only 88 characters in the set.

An actual implementation would not use arbitrary fractions—for a binary coder, it would use unsigned integers of the longest practical length, and as the range narrowed so that the leading bits of both numbers matched, the matching bits would be shifted to the code stream (and the low order bits of each of the integers would be filled with zeros and ones, respectively).

A UTF-8 coder, using the appropriate range, would track the range using two arrays of values in the range 0-93, and it would shift values from the array when the high-order values match, filling the low order values with 0 or 93, as appropriate.

Since the code points generated by the coding process will overlap with the literal values, some care needs to be taken to ensure that they can be unambiguously distinguished by the decoder. Literals that fall outside the range U+0021-U+007E can occur at any point in the output, and the first literal that occurs can be output immediately. However, other literals would need to be managed. Two techniques that can be used are to buffer all literals until the end of the stream is reached and output them in reverse order (the decompressor would traverse the compressed stream from both ends, knowing it can stop processing when the pointers from either end of the stream overlap), or buffer all literals until a code value can be output, and then output that code value and all of the literals buffered to that point (resetting the buffer afterwards).

It should be possible to determine the number of literals to consume from the compressed stream from processing the code value consumed. Since buffering all of the literals until the end of the input stream is reached could hinder streaming operation, the second management technique is preferred.

Since UTF-16 can be restricted to a binary-efficient range (using code points in the range U+0100-U+80FF gives 15 usable bits for every 16 bits transmitted, an efficiency of 93.75%), it would be appropriate for an adaptive Huffman coder. Literals management is still important.

Figure 2:
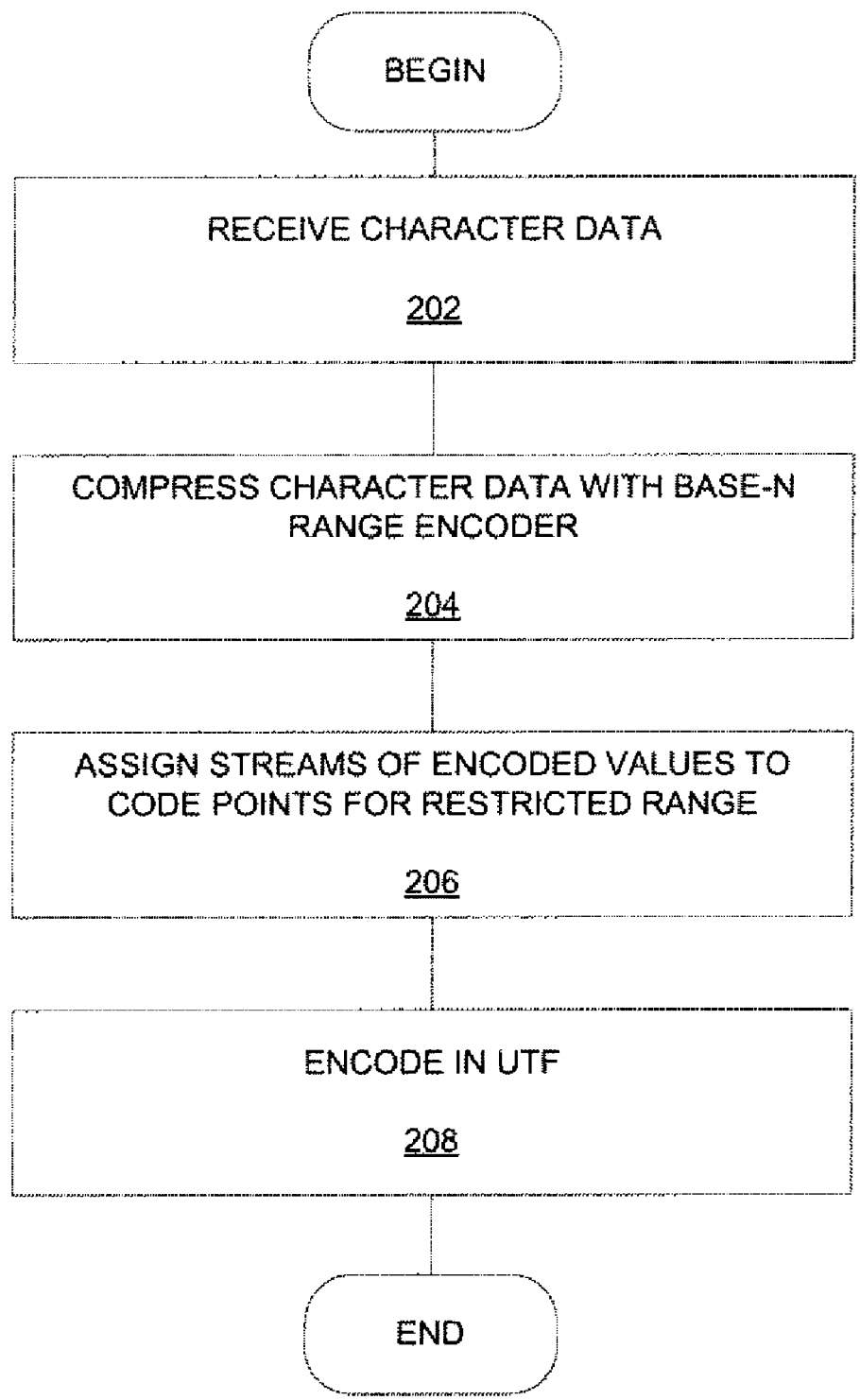
FIG. 2 is a flow diagram illustrating one embodiment of a method for compressing a character data set.

FIG. 2 is a flow diagram illustrating one embodiment of a method for compressing a character data set. At 202, a character data set is received. At 204, the character data set is compressed using an entropy encoder to generate a stream of encoded values. At 206, the stream of encoded values is assigned to code points from some restricted range in UTF and interprets them as bit strings. At 208, the stream of encoded values is encoded in UTF according to the previous description.

Figure 3:
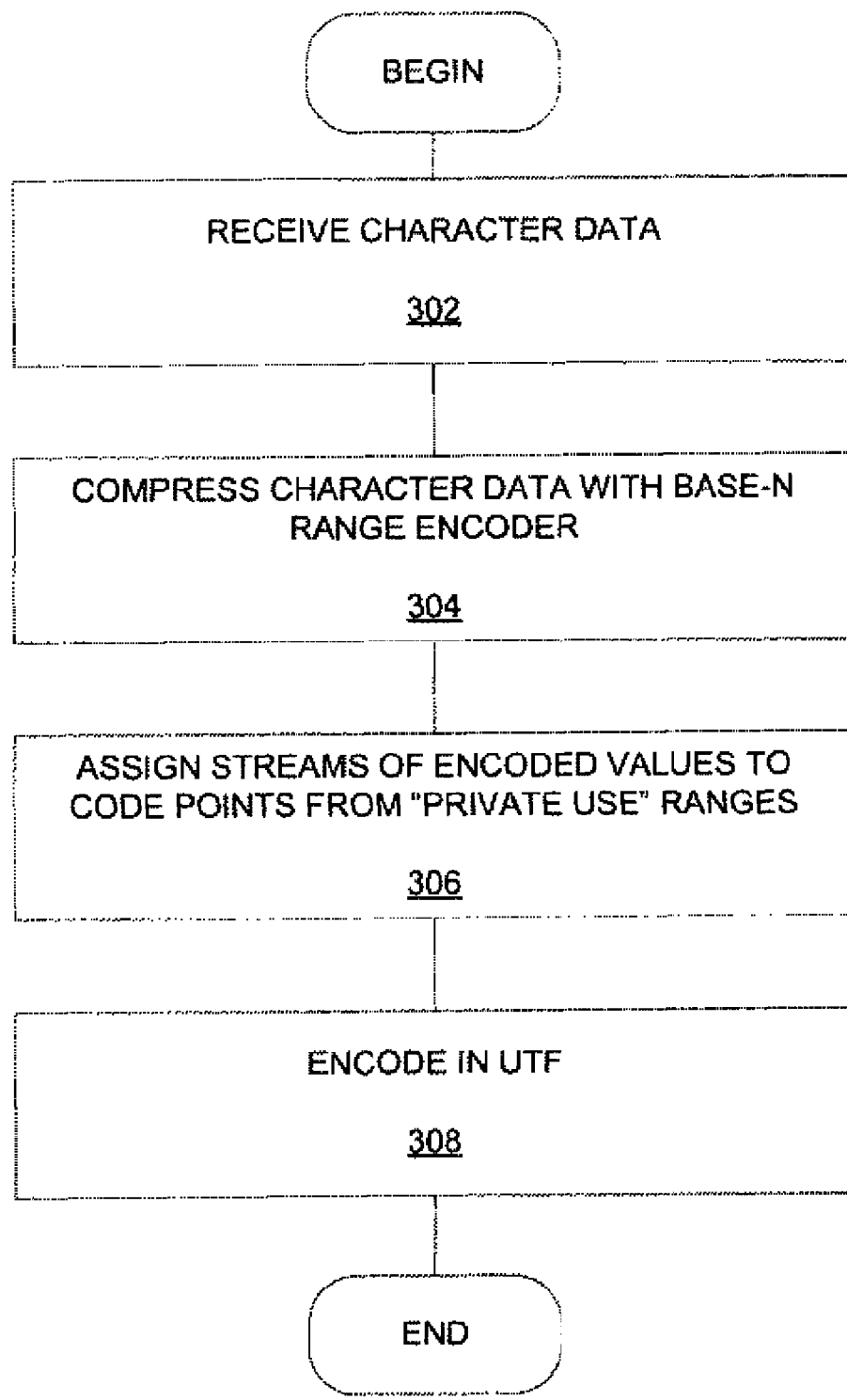
FIG. 3 is a flow diagram illustrating another embodiment of a method for compressing a character data set.

FIG. 3 is a flow diagram illustrating another embodiment of a method for compressing a character data set. At 302, a character data set is received. At 304, the character data set is compressed using an entropy encoder. At 306, the stream of encoded values is assigned to code points from the "private use" ranges to represent bit strings, and let other code points represent themselves. At 308, the stream of encoded values is encoded in UTF according to the previous description.

Embodiments of the present invention may operate as a machine in the exemplary form of a computer system within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system of described herein includes a processing device, a main memory (e.g., read-only memory (ROM), flash memory, dynamic random access memory (DRAM) such as synchronous DRAM (SDRAM), a static memory (e.g., flash memory, static random access memory (SRAM), etc.), and a data storage device, which communicate with each other via a bus.

Processing device represents one or more general-purpose processing devices such as a microprocessor, central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device may also be one or more special-purpose processing devices such as an application specific integrated circuit (ASIC), a field programmable gate array (FPGA), a digital signal processor (DSP), network processor, or the like. The processing device is configured to execute the processing logic for performing the operations and steps discussed herein.

The computer system further include a network interface device.

The data storage device may include a machine-accessible storage medium on which is stored one or more sets of instructions (e.g., software) embodying any one or more of the methodologies or functions described herein. The software may also reside, completely or at least partially, within the main memory and/or within the processing device during execution thereof by the computer system, the main memory and the processing device also constituting machine-accessible storage media. The software may further be transmitted or received over a network via the network interface device.

While the computer-accessible storage medium is shown in an exemplary embodiment to be a single medium, the term "computer-accessible storage medium" should be taken to include a single medium or multiple media (e.g., a centralized or distributed database, and/or associated caches and servers) that store the one or more sets of instructions. The term "computer-accessible storage medium" shall also be taken to include any medium that is capable of storing, encoding or carrying a set of instructions for execution by the machine and that cause the machine to perform any one or more of the methodologies of the present invention. The term "computer-accessible storage medium" shall accordingly be taken to include, but not be limited to, solid-state memories, optical and magnetic media.

In the above description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method comprising:
   receiving a character data set for transcoding;
   compressing the character data set with a base-n range encoder of a compression algorithm module of a computer system to generate one or more streams of encoded values, n being an integer number equal to the number of code points of a Unicode format in a predetermined range that is a fraction of a total code range of Unicode characters;
   assigning the encoded values to the predetermined range of the code points in the Unicode format with a code points mapper of the computer system; and
   encoding the streams of assigned encoded values with a Unicode Transformation Format (UTF) of the computer system.

2. The computer-implemented method of claim 1 wherein the base-n range encoder is configured to use the code points from a restricted UTF range and interpret the code points as bit strings.

3. The computer-implemented method of claim 1 wherein the base-n range encoder is configured to use the code points from a private use ranges and interpret the code points as bit strings.

4. The computer-implemented method of claim 1 wherein the compression algorithm module further includes an adaptive Huffman coder.

5. The computer-implemented method of claim 4 wherein an output of the compression algorithm module includes a representation of a fraction that lies within the predicted probability distribution of the input stream.

6. The computer-implemented method of claim 1 further comprising:
buffering all literal values the end of the input stream is reached; and
outputting a compressed stream in reverse order.

7. The computer-implemented method of claim 1 further comprising:
buffering all literal values until a code value can be output;
outputting the code value and all literal values buffered to that point; and
resetting the buffer.

8. A non-transitory computer-readable storage medium, having instructions stored therein, which when executed, cause a computer system to perform a method comprising:
receiving a character data set for transcoding;
compressing the character data set with an base-n range encoder of a compression algorithm module of a computer system to generate one or more streams of encoded values, n being an integer number equal to the number of code points of a Unicode format in a predetermined range that is a fraction of a total code range of Unicode characters;
assigning the encoded values to the predetermined range of the code points in the Unicode format with a code points mapper of the computer system; and
encoding the streams of assigned encoded values with a Unicode Transformation Format (UTF) encoder of the computer system.

9. The computer-readable storage medium of claim 8 wherein the base-n range encoder is configured to use the code points from a restricted UTF range and interpret the code points as bit strings.

10. The computer-readable storage medium of claim 8 wherein the base-n range encoder is configured to use the code points from a private use ranges and interpret the code points as bit strings.

11. The computer-readable storage medium of claim 8 wherein the compression algorithm module further includes an adaptive Huffman coder.

12. The computer-readable storage medium of claim 11 wherein an output of the compression algorithm module includes a representation of a fraction that lies within the predicted probability distribution of the input stream.

13. The computer-readable storage medium of claim 8 wherein the method further comprises:
buffering all literal values until the end of the input stream is reached; and
outputting a compressed stream in reverse order.

14. The computer-readable storage medium of claim 8 wherein the method further comprises:
buffering all literal values until a code value can be output;
outputting the code value and all literal values buffered to that point; and
resetting the buffer.

15. A computer system comprising:
a processing device;
a storage device coupled to the processing device, the storage device configured to store a character data set; and
a compression module coupled to the storage device, the compression module configured receiving the character data set for transcoding, to compress the character data set with an base-n range encoder of the compression module to generate one or more streams of encoded values, wherein n is an integer number equal to the number of code points of a Unicode format in a predetermined range that is a fraction of a total code range of Unicode characters;
a code points mapper coupled to the compression module, the code points mapper configured to assign the encoded values to the predetermined range of the code points in the Unicode format; and
a UTF encoder coupled to the code points mapper, the UTF encoder configured to encode the streams of assigned encoded values using a Unicode Transformation Format (UTF).

16. The computer system of claim 15 wherein the base-n range encoder is configured to use the code points from a restricted UTF range and interpret the code points as bit strings.

17. The computer system of claim 15 wherein the base-n range encoder is configured to use the code points from a private use ranges and interpret the code points as bit strings.

18. The computer system of claim 15 wherein the compression algorithm module further includes an adaptive Huffman coder.

19. The computer system of claim 15 wherein the compression module is further configured to buffer all literal values until the end of the input stream is reached, and to output a compressed stream in reverse order.

20. The computer system of claim 15 wherein the compression module is further configured to buffer all literal values until a code value can be output, to output the code value and all literal values buffered to that point, and to reset the buffer.

* * * * *